United States Patent
Lindert

(10) Patent No.: US 8,502,293 B2
(45) Date of Patent: Aug. 6, 2013

(54) CAPACITOR WITH RECESSED PLATE PORTION FOR DYNAMIC RANDOM ACCESS MEMORY (DRAM) AND METHOD TO FORM THE SAME

(75) Inventor: Nick Lindert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 245 days.

(21) Appl. No.: 12/976,538

(22) Filed: Dec. 22, 2010

(65) Prior Publication Data

US 2012/0161280 A1 Jun. 28, 2012

(51) Int. Cl.
*H01L 27/108* (2006.01)
*H01L 21/8242* (2006.01)

(52) U.S. Cl.
USPC ........... 257/301; 257/532; 438/243; 438/259; 438/386

(58) Field of Classification Search
USPC .. 438/243, 244, 259, 270, 386, 387; 257/301, 257/303, 532
See application file for complete search history.

(56) References Cited

U.S. PATENT DOCUMENTS

| | | | |
|---|---|---|---|
| 6,794,694 B2 | 9/2004 | Diodato et al. | |
| 7,476,922 B2 | 1/2009 | Won et al. | |
| 7,525,143 B2 | 4/2009 | Chae | |
| 2001/0036051 A1 | 11/2001 | Kataoka | |
| 2003/0129805 A1 | 7/2003 | Kim | |
| 2007/0275536 A1* | 11/2007 | Cremer et al. | 438/381 |
| 2010/0079924 A1 | 4/2010 | Keating et al. | |
| 2010/0219502 A1* | 9/2010 | Shieh et al. | 257/532 |
| 2011/0298089 A1* | 12/2011 | Krishnan et al. | 257/532 |

FOREIGN PATENT DOCUMENTS

KR 1020020016308 3/2002

OTHER PUBLICATIONS

International Search Report and Written Opinion from PCT/US2011/061630 mailed May 17, 2012, 8 pgs.

\* cited by examiner

*Primary Examiner* — Hsien Ming Lee
(74) *Attorney, Agent, or Firm* — Blakely, Sokoloff, Taylor & Zafman LLP

(57) ABSTRACT

A capacitor includes a trench disposed in a first dielectric layer disposed above a substrate. A first metal plate is disposed along the bottom and sidewalls of the trench. A second dielectric layer is disposed on and conformal with the first metal plate. A portion of the first metal plate directly adjacent to the second dielectric layer is recessed relative to the sidewalls of the second dielectric layer. A second metal plate is disposed on and conformal with the second dielectric layer. A portion of the second metal plate directly adjacent to the second dielectric layer is recessed relative to the sidewalls of the second dielectric layer. A third dielectric layer is disposed above the first metal plate, the second dielectric layer, and the second metal plate, and disposed between the first metal plate and the second dielectric layer and between the second metal plate and the second dielectric layer.

37 Claims, 3 Drawing Sheets

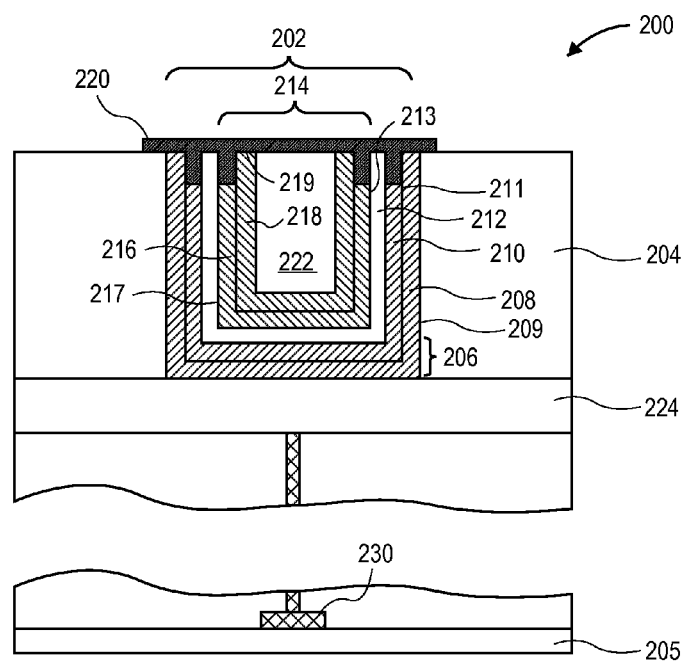
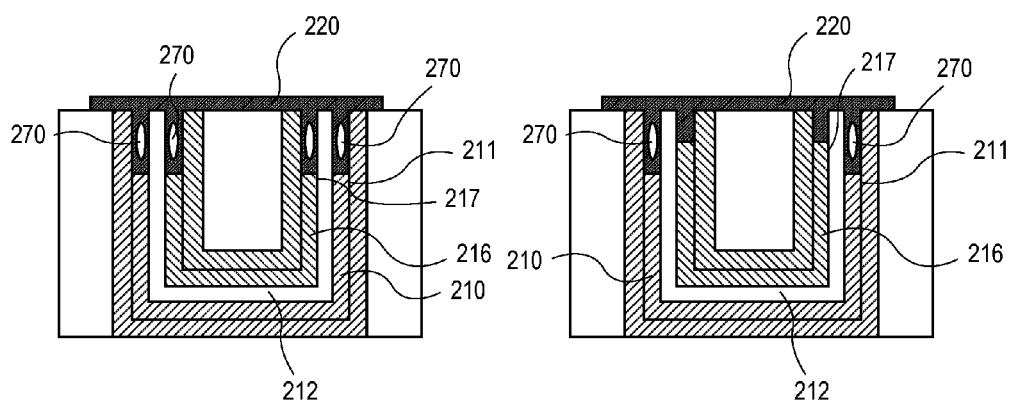
FIG. 2
FIG. 3A  FIG. 3B

US 8,502,293 B2

CAPACITOR WITH RECESSED PLATE PORTION FOR DYNAMIC RANDOM ACCESS MEMORY (DRAM) AND METHOD TO FORM THE SAME

TECHNICAL FIELD

Embodiments of the invention are in the field of dynamic random access memory and, in particular, capacitors with recessed plate portions for dynamic random access memory (DRAM) and methods to form the same.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In semiconductor devices such as DRAMs (Dynamic Random Access Memory), each cell is composed of one transistor and one capacitor. In DRAMs, cells require periodic reading and refreshing. Owing to the advantages of low price-per-unit-bit, high integration, and ability to simultaneously perform read and write operations, DRAMs have enjoyed widespread use in commercial applications. In the meantime, a phenomenon referred to as "soft error" can be caused in DRAM devices by a loss of charge that was stored in a capacitor due to external factors, thereby causing malfunction of DRAMs. In order to prevent the occurrence of soft error, a method of enhancing the capacitance of a capacitor has been suggested. The capacitance of the capacitor can be enhanced by suppressing leakage current. Although many studies have been investigated in the area of suppressing leakage current, challenges are presented in formulating practical manufacturing processes due to the ever increasing high level of integration of semiconductor devices.

BRIEF DESCRIPTION OF THE DRAWINGS

FIG. 2 illustrates a cross-sectional view of a capacitor, in accordance with an embodiment of the present invention.

FIG. 3A illustrates a cross-sectional view of a portion of a capacitor, in accordance with another embodiment of the present invention.

FIG. 3B illustrates a cross-sectional view of a portion of a capacitor, in accordance with another embodiment of the present invention.

DETAILED DESCRIPTION

Capacitors with recessed plate portions for dynamic random access memory (DRAM) and methods to form the same are described. In the following description, numerous specific details are set forth, such as layouts for capacitor arrays and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Figure 1A:
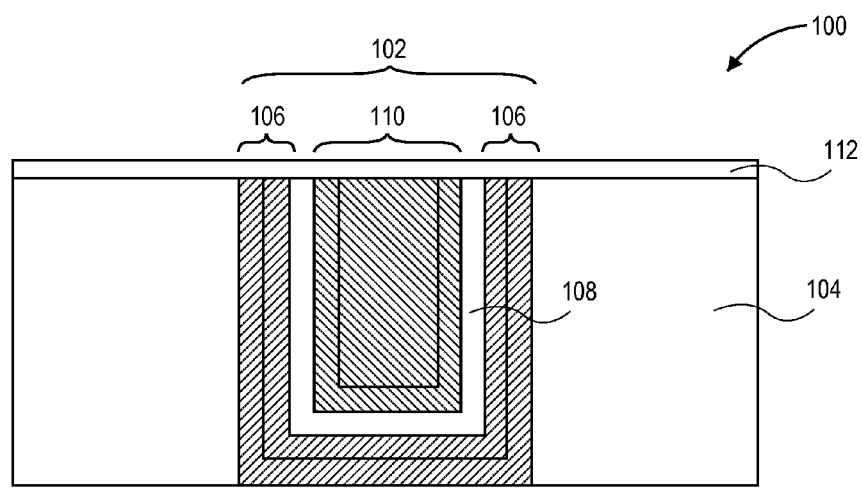
FIG. 1A illustrates a cross-sectional view of a portion of an embedded capacitor.

A multi-layered cup-shaped capacitor may be fabricated to be embedded in a semiconductor structure. However, care may need to be taken to ensure that leakage current between layers of the capacitor is negligible or non-existent. As an example, FIG. 1A illustrates a cross-sectional view of a portion of an embedded capacitor 100. Capacitor 100 includes a trench 102 disposed in a first dielectric layer 104. A first metal plate 106 is disposed along the bottom and sidewalls of the trench 102. A second dielectric layer 108 is disposed on and conformal with the first metal plate 106. A second metal plate 110 is disposed on and conformal with the second dielectric layer 108. A top layer 112 is disposed above the first metal plate 106, the second dielectric layer 108, and the second metal plate 110. One possible issue with the arrangement shown in FIG. 1A is the opportunity for leakage current between the first metal plate 106 and the second metal plate 110 through, e.g., top layer 112.

Figure 1B:
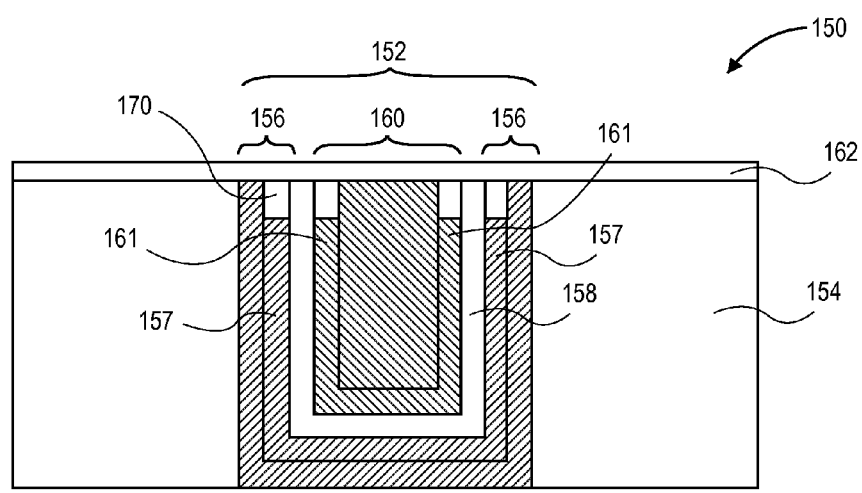
FIG. 1B illustrates a cross-sectional view of a portion of an embedded capacitor.

Recessing portions of the plates in an embedded capacitor may mitigate the above mentioned leakage current. For example, FIG. 1B illustrates a cross-sectional view of a portion of an embedded capacitor 150. Capacitor 150 includes a trench 152 disposed in a first dielectric layer 154. A first metal plate 156 is disposed along the bottom and sidewalls of the trench 152. A second dielectric layer 158 is disposed on and conformal with the first metal plate 156. A portion 157 of the first metal plate 156 directly adjacent to the second dielectric layer 158 is recessed relative to the sidewalls of the second dielectric layer 158. A second metal plate 160 is disposed on and conformal with the second dielectric layer 158. A portion 161 of the second metal plate 160 directly adjacent to the second dielectric layer is recessed relative to the sidewalls of the second dielectric layer 158. A top layer 162 is disposed above the first metal plate 156, the second dielectric layer 158, and the second metal plate 160. One possible issue with the arrangement shown in FIG. 1B, however, is the opportunity for leakage current if conductive contaminants are trapped in voids 170. That is, even if recessing is performed to form voids, the plates of the capacitor may be shorted across the top of the insulator layer of the capacitor by a defect or contaminant.

Disclosed herein are embedded metal-insulator-metal (MIM) capacitors for semiconductor devices. In one embodiment, a trench is disposed in a first dielectric layer disposed above a substrate. A first metal plate is disposed along the bottom and sidewalls of the trench. A second dielectric layer is disposed on and conformal with the first metal plate. A portion of the first metal plate directly adjacent to the second dielectric layer is recessed relative to the sidewalls of the second dielectric layer. A second metal plate is disposed on and conformal with the second dielectric layer. A portion of the second metal plate directly adjacent to the second dielectric layer is recessed relative to the sidewalls of the second dielectric layer. A third dielectric layer is disposed above the first metal plate, the second dielectric layer, and the second metal plate, and disposed between the first metal plate and the second dielectric layer and between the second metal plate and the second dielectric layer.

Also disclosed herein are methods of fabricating embedded metal-insulator-metal (MIM) capacitors for semiconductor devices. In one embodiment, a method includes forming a trench in a first dielectric layer formed above a substrate. A first cup-shaped metal plate is formed along the bottom and sidewalls of the trench, the first cup-shaped metal plate including a first outer cup-shaped conductive layer and a first inner cup-shaped conductive layer. A cup-shaped dielectric layer is formed on and conformal with the first cup-shaped metal plate. A second cup-shaped metal plate is formed on and conformal with the cup-shaped dielectric layer, the second cup-shaped metal plate including a second outer cup-shaped conductive layer and an inner conductive layer. The sidewalls of the first inner cup-shaped conductive layer are recessed relative to the sidewalls of the first outer cup-shaped conductive layer and to the sidewalls of the cup-shaped dielectric layer. The sidewalls of the second outer cup-shaped conductive layer are recessed relative to the top surface of the inner conductive layer and to the sidewalls of the cup-shaped dielectric layer. A second dielectric layer is formed above the first cup-shaped metal plate, the cup-shaped dielectric layer, and the second cup-shaped metal plate, and between the first inner cup-shaped conductive layer and the cup-shaped dielectric layer and between the second outer cup-shaped conductive layer and the cup-shaped dielectric layer.

In an aspect of the present invention, an embedded metal-insulator-metal (MIM) capacitor with a recessed plate portion is provided. FIG. 3 illustrates a cross-sectional view of a capacitor, in accordance with an embodiment of the present invention.

Referring to FIG. 2, an embedded metal-insulator-metal (MIM) capacitor 200 for a semiconductor device includes a trench 202 disposed in a first dielectric layer 204 disposed above a substrate 205. A first cup-shaped metal plate 206 is disposed along the bottom and sidewalls of the trench 202. The first cup-shaped metal plate 206 includes a first outer cup-shaped conductive layer 208 and a first inner cup-shaped conductive layer 210. A cup-shaped dielectric layer 212 is disposed on and conformal with the first cup-shaped metal plate 206. The sidewalls 211 of the first inner cup-shaped conductive layer 210 are recessed relative to the sidewalls 209 of the first outer cup-shaped conductive layer 208 and to the sidewalls 213 of the cup-shaped dielectric layer 212. A second cup-shaped metal plate 214 is disposed on and conformal with the cup-shaped dielectric layer 212. The second cup-shaped metal plate 214 includes a second outer cup-shaped conductive layer 216 and an inner conductive layer 218. The sidewalls 217 of the second outer cup-shaped conductive layer 216 are recessed relative to the top surface 219 of the inner conductive layer 218 and to the sidewalls 213 of the cup-shaped dielectric layer 212. A second dielectric layer 220 is disposed above the first cup-shaped metal plate 206, the cup-shaped dielectric layer 212, and the second cup-shaped metal plate 214, and is disposed between the first inner cup-shaped conductive layer 210 and the cup-shaped dielectric layer 212 and between the second outer cup-shaped conductive layer 216 and the cup-shaped dielectric layer 212.

In an embodiment, the sidewalls 217 of the second outer cup-shaped conductive layer 216 are recessed to approximately the same height as the sidewalls 211 of the first inner cup-shaped conductive layer 210, and the second dielectric layer 220 completely fills the space between the first inner cup-shaped conductive layer 210 and the cup-shaped dielectric layer 212 and completely fills the space between the second outer cup-shaped conductive layer 216 and the cup-shaped dielectric layer 212, as depicted in FIG. 2. However, in another embodiment, referring to FIG. 3A, the sidewalls 217 of the second outer cup-shaped conductive layer 216 are recessed to approximately the same height as the sidewalls 211 of the first inner cup-shaped conductive layer 210, but the second dielectric layer 220 only partially fills the space between the first inner cup-shaped conductive layer 210 and the cup-shaped dielectric layer 212 and only partially fills the space between the second outer cup-shaped conductive layer 216 and the cup-shaped dielectric layer 212, leaving voids 270. In yet another embodiment, referring to FIG. 3B, the sidewalls 217 of the second outer cup-shaped conductive layer 216 are recessed to a height above the height of the sidewalls 211 of the first inner cup-shaped conductive layer 210, and the second dielectric layer 220 only partially fills the space between the first inner cup-shaped conductive layer 210 and the cup-shaped dielectric layer 212, leaving voids 270, but completely fills the space between the second outer cup-shaped conductive layer 216 and the cup-shaped dielectric layer 212.

In an embodiment, the first dielectric layer 204 is a low-K dielectric layer (a layer with a dielectric constant less than 4 for silicon dioxide). In one embodiment, the first dielectric layer 204 is formed by a process such as, but not limited to, a spin-on process, a chemical vapor deposition process, or a polymer-based chemical vapor deposition process. In a specific embodiment, the first dielectric layer 204 is formed by a chemical vapor deposition process involving silane or an organo-silane as a precursor gas. In an embodiment, the first dielectric layer 204 is composed of a material that does not significantly contribute to leakage current between a series of metal interconnects subsequently formed in or on the first dielectric layer 204. In one embodiment, the first dielectric layer 204 is composed of a material in the range of 2.5 to less than 4. In a particular embodiment, the first dielectric layer 204 is composed of a material such as, but not limited to, a silicate or a carbon-doped oxide with 0-10% porosity. In another embodiment, however, the first dielectric layer 204 is composed of silicon dioxide.

In an embodiment, the cup-shaped dielectric layer 212 is a first high-K dielectric layer, and the second dielectric layer 220 is a second high-K dielectric layer. A high-K dielectric layer refers to a layer with a dielectric constant greater than 4 for silicon dioxide. In one embodiment, one or both of the cup-shaped dielectric layer 212 and the second dielectric layer 220 are formed by an atomic vapor deposition process or a chemical vapor deposition process and are composed of a material such as, but not limited to, silicon oxy-nitride, hafnium oxide, zirconium oxide, hafnium silicate, hafnium oxy-nitride or lanthanum oxide. For example, in a specific embodiment, the first high-K dielectric layer (i.e. cup-shaped dielectric layer 212) is composed of hafnium oxide ($HfO_2$), and the second high-K dielectric layer (i.e. the second dielectric layer 220) is composed of aluminum oxide ($Al_2O_3$). In another embodiment, however, one or both of the cup-shaped dielectric layer 212 and the second dielectric layer 220 are composed of silicon dioxide.

In an embodiment, the first outer cup-shaped conductive layer 208 is composed of tantalum. In an embodiment, both the first inner cup-shaped conductive layer 210 and the second outer cup-shaped conductive layer 216 are composed of titanium nitride. In one embodiment, one or more of the first inner cup-shaped conductive layer 210 and the second outer cup-shaped conductive layer 216 is formed by a technique such as, but not limited to, an electro-chemical deposition process, an electro-less deposition process, a chemical vapor deposition process, an atomic layer deposition (ALD) process, or a reflow process. In an embodiment, the inner conductive layer 218 of the second cup-shaped metal plate 214 is a second inner cup-shaped conductive layer, as depicted in FIG. 2, and may be composed of, e.g., tantalum. The second cup-shaped metal plate 214 further includes a conductive trench-fill layer 222, as is also depicted in FIG. 2. In one embodiment, the trench-fill layer 222 is composed of copper. It is to be understood, however, that silver, aluminum, or an alloy of copper, silver or aluminum may be used in place of copper. In an alternative embodiment, the inner conductive layer 218 fills trench 202.

Referring again to FIG. 2, in an embodiment, the first cup-shaped metal plate 206 is electrically coupled to an underlying transistor 230 disposed above the substrate 205. In one embodiment, the transistor 230 is included in a dynamic random access memory (DRAM circuit). In a specific embodiment, the first cup-shaped metal plate 206 is electrically coupled to the underlying transistor 230 by a floor metal layer 224, such as a copper layer, disposed below the first dielectric layer 204, as depicted in FIG. 2.

In an embodiment, substrate 205 is composed of a material suitable for semiconductor device fabrication. In one embodiment, substrate 205 is a bulk substrate composed of a single crystal of a material which may include, but is not limited to, silicon, germanium, silicon-germanium or a III-V compound semiconductor material. In another embodiment, substrate 205 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 205 includes a top epitaxial layer on a middle insulator layer which is above a lower bulk layer. The top epitaxial layer is composed of a single crystal layer which may include, but is not limited to, silicon (e.g., to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 205 may further include dopant impurity atoms.

In accordance with an embodiment of the present invention, substrate 205 has thereon an array of complimentary metal-oxide-semiconductor (CMOS) transistors fabricated in a silicon substrate and encased in a dielectric layer. A plurality of metal interconnects may be formed above the transistors, and on the surrounding dielectric layer, and are used to electrically connect the transistors to form an integrated circuit. In one embodiment, the integrated circuit is used for a DRAM. Also, although only a single capacitor was described in association with FIG. 2, an array of capacitors may be included in a single product.

Figure 4:
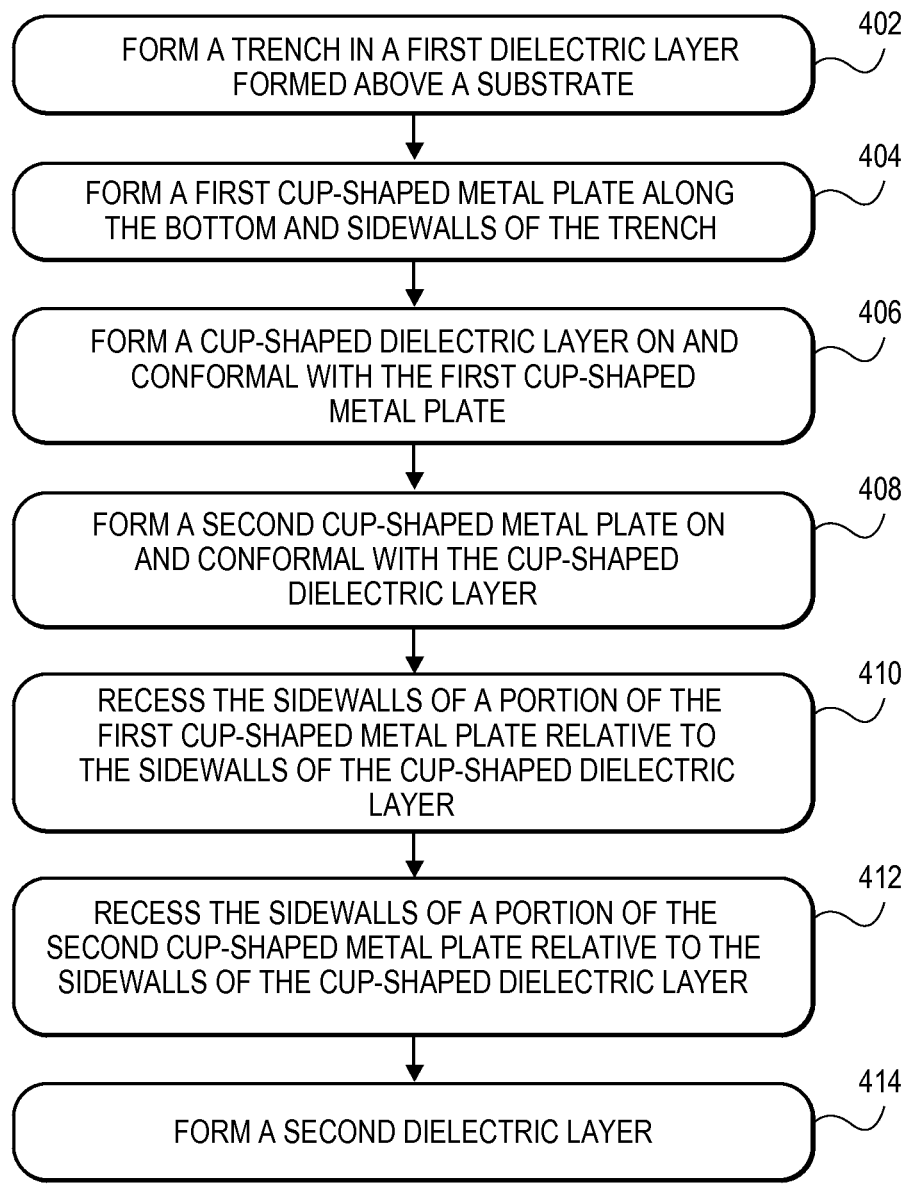
FIG. 4 is a Flowchart representing operations in a method of forming an embedded metal-insulator-metal (MIM) capacitor in accordance with an embodiment of the present invention.

In another aspect of the present invention, a method of fabricating an embedded metal-insulator-metal (MIM) capacitor with a recessed plate portion is provided. FIG. 4 is a Flowchart 400 representing operations in a method of forming an embedded metal-insulator-metal (MIM) capacitor in accordance with an embodiment of the present invention.

Referring to operation 402 of Flowchart 400, a trench is formed in a first dielectric layer formed above a substrate. In an embodiment, the first dielectric layer is a low-K dielectric layer.

Referring to operation 404 of Flowchart 400, a first cup-shaped metal plate is formed along the bottom and sidewalls of the trench. In an embodiment, the first cup-shaped metal plate includes a first outer cup-shaped conductive layer and a first inner cup-shaped conductive layer. In one embodiment, the first outer cup-shaped conductive layer is composed of tantalum. In one embodiment, the first inner cup-shaped conductive layer is composed of titanium nitride.

Referring to operation 406 of Flowchart 400, a cup-shaped dielectric layer is formed on and conformal with the first cup-shaped metal plate. In an embodiment, forming the cup-shaped dielectric layer includes using an atomic layer deposition (ALD) process. In an embodiment, the cup-shaped dielectric layer is a first high-K dielectric layer. In one embodiment, the first high-K dielectric layer is composed of hafnium oxide ($HfO_2$).

Referring to operation 408 of Flowchart 400, a second cup-shaped metal plate is formed on and conformal with the cup-shaped dielectric layer. In an embodiment, the second cup-shaped metal plate includes a second outer cup-shaped conductive layer and an inner conductive layer. In one embodiment, the inner conductive layer of the second cup-shaped metal plate is a second inner cup-shaped conductive layer, and the second cup-shaped metal plate further includes a conductive trench-fill layer. In a specific embodiment, the second inner cup-shaped conductive layer is composed of tantalum. In one embodiment, the second outer cup-shaped conductive layer is composed of titanium nitride.

Referring to operation 410 of Flowchart 400, the sidewalls of the first inner cup-shaped conductive layer are recessed relative to the sidewalls of the first outer cup-shaped conductive layer and to the sidewalls of the cup-shaped dielectric layer. In an embodiment, recessing the sidewalls of the first inner cup-shaped conductive layer includes using a wet etch process.

Referring to operation 412 of Flowchart 400, the sidewalls of the second outer cup-shaped conductive layer are recessed relative to the top surface of the inner conductive layer and to the sidewalls of the cup-shaped dielectric layer. In an embodiment, recessing the sidewalls of the second outer cup-shaped conductive layer includes using a wet etch process. In one embodiment, recessing the sidewalls of the first inner cup-shaped conductive layer is performed in the same process operation as recessing the sidewalls of the second outer cup-shaped conductive layer. In one embodiment, recessing the sidewalls of the first inner cup-shaped conductive layer is performed in a different process operation from recessing the sidewalls of the second outer cup-shaped conductive layer. In an embodiment, the sidewalls of the second outer cup-shaped conductive layer are recessed to approximately the same height as the sidewalls of the first inner cup-shaped conductive layer. In an embodiment, the sidewalls of the second outer cup-shaped conductive layer are recessed to a height above the height of the sidewalls of the first inner cup-shaped conductive layer.

Referring to operation 414 of Flowchart 400, a second dielectric layer is formed above the first cup-shaped metal plate, the cup-shaped dielectric layer, and the second cup-shaped metal plate, and between the first inner cup-shaped conductive layer and the cup-shaped dielectric layer and between the second outer cup-shaped conductive layer and the cup-shaped dielectric layer. In an embodiment, forming the second dielectric layer includes using an atomic layer deposition (ALD) process. In an embodiment, the second dielectric layer is a second high-K dielectric layer. In one embodiment, the second high-K dielectric layer is composed of aluminum oxide ($Al_2O_3$). In an embodiment, the $Al_2O_3$ is formed at approximately 300 degrees Celsius which may heal any damage at the interfaces of the layers of the embedded capacitor. Also, this approach may enable use of a relatively shallow recess approach.

In an embodiment, the sidewalls of the second outer cup-shaped conductive layer are recessed to approximately the same height as the sidewalls of the first inner cup-shaped conductive layer, and the second dielectric layer completely fills the space between the first inner cup-shaped conductive layer and the cup-shaped dielectric layer and completely fills the space between the second outer cup-shaped conductive layer and the cup-shaped dielectric layer.

In another embodiment, the sidewalls of the second outer cup-shaped conductive layer are recessed to approximately the same height as the sidewalls of the first inner cup-shaped conductive layer, and the second dielectric layer only partially fills the space between the first inner cup-shaped conductive layer and the cup-shaped dielectric layer and only partially fills the space between the second outer cup-shaped conductive layer and the cup-shaped dielectric layer. Such a deeper recess may reduce cap leakage defects.

In another embodiment, the sidewalls of the second outer cup-shaped conductive layer are recessed to a height above the height of the sidewalls of the first inner cup-shaped conductive layer, and the second dielectric layer only partially fills the space between the first inner cup-shaped conductive layer and the cup-shaped dielectric layer and completely fills the space between the second outer cup-shaped conductive layer and the cup-shaped dielectric layer. Such a one-sided deep recess may enable grater capacitance within the capacitor, anchor one side of the insulator layer of the capacitor, and may enable registration relaxation. In order to achieve different relative recess depths during the recessing, thickness of the layers to be recessed may be sized according to the desired etch rate. For example, a thicker metal provides more access for a wet etchant and therefore has a faster etch rate as compared with a thinner metal.

In an embodiment, the method of forming an embedded metal-insulator-metal (MIM) capacitor further includes electrically coupling the capacitor to an underlying transistor disposed above the substrate. In one embodiment, the transistor is included in a dynamic random access memory (DRAM circuit). In one embodiment, the cup-shaped metal plate is electrically coupled to the underlying transistor by a floor metal layer disposed below the first dielectric layer.

Thus, capacitors with recessed plate portions for dynamic random access memory (DRAM) and methods to form the same have been disclosed. In an embodiment, a capacitor includes a trench disposed in a first dielectric layer disposed above a substrate. A first metal plate is disposed along the bottom and sidewalls of the trench. A second dielectric layer is disposed on and conformal with the first metal plate. A portion of the first metal plate directly adjacent to the second dielectric layer is recessed relative to the sidewalls of the second dielectric layer. A second metal plate is disposed on and conformal with the second dielectric layer. A portion of the second metal plate directly adjacent to the second dielectric layer is recessed relative to the sidewalls of the second dielectric layer. A third dielectric layer is disposed above the first metal plate, the second dielectric layer, and the second metal plate, and disposed between the first metal plate and the second dielectric layer and between the second metal plate and the second dielectric layer. In one embodiment, the first dielectric layer is a low-K dielectric layer, the second dielectric layer is a first high-K dielectric layer, and the third dielectric layer is a second high-K dielectric layer. In one embodiment, the portion of the first metal plate directly adjacent to the second dielectric layer is recessed to approximately to the same extent as the portion of the second metal plate directly adjacent to the second dielectric layer. In one embodiment, the portion of the first metal plate directly adjacent to the second dielectric layer is recessed to a greater extent than the portion of the second metal plate directly adjacent to the second dielectric layer.

What is claimed is:

1. An embedded metal-insulator-metal (MIM) capacitor for a semiconductor device, the capacitor comprising:
   a trench disposed in a first dielectric layer disposed above a substrate;
   a first metal plate disposed along the bottom and sidewalls of the trench and having an uppermost surface;
   a second dielectric layer disposed on and conformal with the first metal plate, a portion of the first metal plate directly adjacent to the second dielectric layer recessed relative to the sidewalls of the second dielectric layer, wherein the second dielectric layer has an uppermost surface essentially co-planar with the uppermost surface of the first metal plate;
   a second metal plate disposed on and conformal with the second dielectric layer, a portion of the second metal plate directly adjacent to the second dielectric layer recessed relative to the sidewalls of the second dielectric layer; and
   a third dielectric layer disposed above the first metal plate, the second dielectric layer, and the second metal plate, and disposed between the first metal plate and the second dielectric layer and between the second metal plate and the second dielectric layer.

2. The capacitor of claim 1, wherein the first dielectric layer is a low-K dielectric layer, the second dielectric layer is a first high-K dielectric layer, and the third dielectric layer is a second high-K dielectric layer.

3. The capacitor of claim 1, wherein the portion of the first metal plate directly adjacent to the second dielectric layer is recessed to approximately to the same extent as the portion of the second metal plate directly adjacent to the second dielectric layer.

4. The capacitor of claim 1, wherein the portion of the first metal plate directly adjacent to the second dielectric layer is recessed to a greater extent than the portion of the second metal plate directly adjacent to the second dielectric layer.

5. An embedded metal-insulator-metal (MIM) capacitor for a semiconductor device, the capacitor comprising:
   a trench disposed in a first dielectric layer disposed above a substrate;
   a first cup-shaped metal plate disposed along the bottom and sidewalls of the trench, the first cup-shaped metal plate comprising a first outer cup-shaped conductive layer and a first inner cup-shaped conductive layer, the first outer cup-shaped conductive layer having an uppermost surface;
   a cup-shaped dielectric layer disposed on and conformal with the first cup-shaped metal plate, the sidewalls of the first inner cup-shaped conductive layer recessed relative to the sidewalls of the first outer cup-shaped conductive layer and to the sidewalls of the cup-shaped dielectric layer, wherein the cup-shaped dielectric layer has an uppermost surface essentially co-planar with the uppermost surface of the first outer cup-shaped conductive layer;

a second cup-shaped metal plate disposed on and conformal with the cup-shaped dielectric layer, the second cup-shaped metal plate comprising a second outer cup-shaped conductive layer and an inner conductive layer, and the sidewalls of the second outer cup-shaped conductive layer recessed relative to the top surface of the inner conductive layer and to the sidewalls of the cup-shaped dielectric layer; and a second dielectric layer disposed above the first cup-shaped metal plate, the cup-shaped dielectric layer, and the second cup-shaped metal plate, and disposed between the first outer cup-shaped conductive layer and the cup-shaped dielectric layer and between the inner conductive layer of the second cup-shaped metal plate and the cup-shaped dielectric layer.

6. The capacitor of claim 5, wherein the inner conductive layer of the second cup-shaped metal plate is a second inner cup-shaped conductive layer, and wherein the second cup-shaped metal plate further comprises a conductive trench-fill layer.

7. The capacitor of claim 5, wherein the sidewalls of the second outer cup-shaped conductive layer are recessed to approximately the same height as the sidewalls of the first inner cup-shaped conductive layer, and wherein the second dielectric layer completely fills the space between the first outer cup-shaped conductive layer and the cup-shaped dielectric layer and completely fills the space between the inner conductive layer of the second cup-shaped metal plate and the cup-shaped dielectric layer.

8. The capacitor of claim 5, wherein the sidewalls of the second outer cup-shaped conductive layer are recessed to approximately the same height as the sidewalls of the first inner cup-shaped conductive layer, and wherein the second dielectric layer only partially fills the space between the first outer cup-shaped conductive layer and the cup-shaped dielectric layer and only partially fills the space between the inner conductive layer of the second cup-shaped metal plate and the cup-shaped dielectric layer.

9. The capacitor of claim 5, wherein the sidewalls of the second outer cup-shaped conductive layer are recessed to a height above the height of the sidewalls of the first inner cup-shaped conductive layer, and wherein the second dielectric layer only partially fills the space between the first outer cup-shaped conductive layer and the cup-shaped dielectric layer and completely fills the space between the inner conductive layer of the second cup-shaped metal plate and the cup-shaped dielectric layer.

10. The capacitor of claim 5, wherein the first dielectric layer is a low-K dielectric layer, the cup-shaped dielectric layer is a first high-K dielectric layer, and the second dielectric layer is a second high-K dielectric layer.

11. The capacitor of claim 10, wherein the first high-K dielectric layer comprises hafnium oxide ($HfO_2$), and the second high-K dielectric layer comprises aluminum oxide ($Al_2O_3$).

12. The capacitor of claim 5, wherein the first outer cup-shaped conductive layer comprises tantalum, and wherein both the first inner cup-shaped conductive layer and the second outer cup-shaped conductive layer comprise titanium nitride.

13. The capacitor of claim 5, wherein the first cup-shaped metal plate is electrically coupled, through a floor metal layer disposed below the first dielectric layer, to an underlying transistor disposed above the substrate, the transistor included in a dynamic random access memory (DRAM) circuit.

14. A method of forming an embedded metal-insulator-metal (MIM) capacitor for a semiconductor device, the method comprising:

forming a trench in a first dielectric layer formed above a substrate;

forming a first cup-shaped metal plate along the bottom and sidewalls of the trench, the first cup-shaped metal plate comprising a first outer cup-shaped conductive layer and a first inner cup-shaped conductive layer;

forming a cup-shaped dielectric layer on and conformal with the first cup-shaped metal plate;

forming a second cup-shaped metal plate on and conformal with the cup-shaped dielectric layer, the second cup-shaped metal plate comprising a second outer cup-shaped conductive layer and an inner conductive layer; and, without recessing the cup-shaped dielectric layer, recessing the sidewalls of the first inner cup-shaped conductive layer relative to the sidewalls of the first outer cup-shaped conductive layer and to the sidewalls of the cup-shaped dielectric layer; and, without recessing the cup-shaped dielectric layer, recessing the sidewalls of the second outer cup-shaped conductive layer relative to the top surface of the inner conductive layer and to the sidewalls of the cup-shaped dielectric layer; and forming a second dielectric layer above the first cup-shaped metal plate, the cup-shaped dielectric layer, and the second cup-shaped metal plate, and between the first outer cup-shaped conductive layer and the cup-shaped dielectric layer and between the inner conductive layer of the second cup-shaped metal plate and the cup-shaped dielectric layer.

15. The method of claim 14, wherein recessing the sidewalls of the first inner cup-shaped conductive layer and recessing the sidewalls of the second outer cup-shaped conductive layer comprises using a wet etch process.

16. The method of claim 15, wherein recessing the sidewalls of the first inner cup-shaped conductive layer is performed in the same process operation as recessing the sidewalls of the second outer cup-shaped conductive layer.

17. The method of claim 15, wherein recessing the sidewalls of the first inner cup-shaped conductive layer is performed in a different process operation from recessing the sidewalls of the second outer cup-shaped conductive layer.

18. The method of claim 14, wherein forming the cup-shaped dielectric layer and forming the second dielectric layer comprises using an atomic layer deposition (ALD) process.

19. The method of claim 14, wherein the sidewalls of the second outer cup-shaped conductive layer are recessed to approximately the same height as the sidewalls of the first inner cup-shaped conductive layer.

20. The method of claim 14, wherein the sidewalls of the second outer cup-shaped conductive layer are recessed to a height above the height of the sidewalls of the first inner cup-shaped conductive layer.

21. An embedded metal-insulator-metal (MIM) capacitor for a semiconductor device, the capacitor comprising:

a trench disposed in a first dielectric layer disposed above a substrate;

a first cup-shaped metal plate disposed along the bottom and sidewalls of the trench, the first cup-shaped metal plate comprising a first outer cup-shaped conductive layer and a first inner cup-shaped conductive layer;

a cup-shaped dielectric layer disposed on and conformal with the first cup-shaped metal plate, the sidewalls of the first inner cup-shaped conductive layer recessed relative to the sidewalls of the first outer cup-shaped conductive layer and to the sidewalls of the cup-shaped dielectric layer;

a second cup-shaped metal plate disposed on and conformal with the cup-shaped dielectric layer, the second cup-shaped metal plate comprising a second outer cup-shaped conductive layer and an inner conductive layer, and the sidewalls of the second outer cup-shaped conductive layer recessed relative to the top surface of the inner conductive layer and to the sidewalls of the cup-shaped dielectric layer; and a second dielectric layer disposed above the first cup-shaped metal plate, the cup-shaped dielectric layer, and the second cup-shaped metal plate, and disposed between the first outer cup-shaped conductive layer and the cup-shaped dielectric layer and between the inner conductive layer of the second cup-shaped metal plate and the cup-shaped dielectric layer, wherein the sidewalls of the second outer cup-shaped conductive layer are recessed to approximately the same height as the sidewalls of the first inner cup-shaped conductive layer, and wherein the second dielectric layer only partially fills the space between the first outer cup-shaped conductive layer and the cup-shaped dielectric layer and only partially fills the space between the inner conductive layer of the second cup-shaped metal plate and the cup-shaped dielectric layer.

22. The capacitor of claim 21, wherein the inner conductive layer of the second cup-shaped metal plate is a second inner cup-shaped conductive layer, and wherein the second cup-shaped metal plate further comprises a conductive trench-fill layer.

23. The capacitor of claim 21, wherein the first dielectric layer is a low-K dielectric layer, the cup-shaped dielectric layer is a first high-K dielectric layer, and the second dielectric layer is a second high-K dielectric layer.

24. The capacitor of claim 23, wherein the first high-K dielectric layer comprises hafnium oxide ($HfO_2$), and the second high-K dielectric layer comprises aluminum oxide ($Al_2O_3$).

25. The capacitor of claim 21, wherein the first outer cup-shaped conductive layer comprises tantalum, and wherein both the first inner cup-shaped conductive layer and the second outer cup-shaped conductive layer comprise titanium nitride.

26. The capacitor of claim 21, wherein the first cup-shaped metal plate is electrically coupled, through a floor metal layer disposed below the first dielectric layer, to an underlying transistor disposed above the substrate, the transistor included in a dynamic random access memory (DRAM) circuit.

27. An embedded metal-insulator-metal (MIM) capacitor for a semiconductor device, the capacitor comprising:

a trench disposed in a first dielectric layer disposed above a substrate;

a first cup-shaped metal plate disposed along the bottom and sidewalls of the trench, the first cup-shaped metal plate comprising a first outer cup-shaped conductive layer and a first inner cup-shaped conductive layer;

a cup-shaped dielectric layer disposed on and conformal with the first cup-shaped metal plate, the sidewalls of the first inner cup-shaped conductive layer recessed relative to the sidewalls of the first outer cup-shaped conductive layer and to the sidewalls of the cup-shaped dielectric layer;

a second cup-shaped metal plate disposed on and conformal with the cup-shaped dielectric layer, the second cup-shaped metal plate comprising a second outer cup-shaped conductive layer and an inner conductive layer, and the sidewalls of the second outer cup-shaped conductive layer recessed relative to the top surface of the inner conductive layer and to the sidewalls of the cup-shaped dielectric layer; and a second dielectric layer disposed above the first cup-shaped metal plate, the cup-shaped dielectric layer, and the second cup-shaped metal plate, and disposed between the first outer cup-shaped conductive layer and the cup-shaped dielectric layer and between the inner conductive layer of the second cup-shaped metal plate and the cup-shaped dielectric layer, wherein the sidewalls of the second outer cup-shaped conductive layer are recessed to a height above the height of the sidewalls of the first inner cup-shaped conductive layer, and wherein the second dielectric layer only partially fills the space between the first outer cup-shaped conductive layer and the cup-shaped dielectric layer and completely fills the space between the inner conductive layer of the second cup-shaped metal plate and the cup-shaped dielectric layer.

28. The capacitor of claim 27, wherein the inner conductive layer of the second cup-shaped metal plate is a second inner cup-shaped conductive layer, and wherein the second cup-shaped metal plate further comprises a conductive trench-fill layer.

29. The capacitor of claim 27, wherein the first dielectric layer is a low-K dielectric layer, the cup-shaped dielectric layer is a first high-K dielectric layer, and the second dielectric layer is a second high-K dielectric layer.

30. The capacitor of claim 29, wherein the first high-K dielectric layer comprises hafnium oxide ($HfO_2$), and the second high-K dielectric layer comprises aluminum oxide ($Al_2O_3$).

31. The capacitor of claim 27, wherein the first outer cup-shaped conductive layer comprises tantalum, and wherein both the first inner cup-shaped conductive layer and the second outer cup-shaped conductive layer comprise titanium nitride.

32. The capacitor of claim 27, wherein the first cup-shaped metal plate is electrically coupled, through a floor metal layer disposed below the first dielectric layer, to an underlying transistor disposed above the substrate, the transistor included in a dynamic random access memory (DRAM) circuit.

33. A method of forming an embedded metal-insulator-metal (MIM) capacitor for a semiconductor device, the method comprising:

forming a trench in a first dielectric layer formed above a substrate;

forming a first cup-shaped metal plate along the bottom and sidewalls of the trench, the first cup-shaped metal plate comprising a first outer cup-shaped conductive layer and a first inner cup-shaped conductive layer;

forming a cup-shaped dielectric layer on and conformal with the first cup-shaped metal plate;

forming a second cup-shaped metal plate on and conformal with the cup-shaped dielectric layer, the second cup-shaped metal plate comprising a second outer cup-shaped conductive layer and an inner conductive layer;

recessing the sidewalls of the first inner cup-shaped conductive layer relative to the sidewalls of the first outer cup-shaped conductive layer and to the sidewalls of the cup-shaped dielectric layer;

recessing the sidewalls of the second outer cup-shaped conductive layer relative to the top surface of the inner conductive layer and to the sidewalls of the cup-shaped dielectric layer, wherein the sidewalls of the second outer cup-shaped conductive layer are recessed to a height above the height of the sidewalls of the first inner cup-shaped conductive layer; and forming a second dielectric layer above the first cup-shaped metal plate, the cup-shaped dielectric layer, and the second cup-shaped metal plate, and between the first outer cup-shaped conductive layer and the cup-shaped dielectric layer and between the inner conductive layer of the second cup-shaped metal plate and the cup-shaped dielectric layer.

34. The method of claim 33, wherein recessing the sidewalls of the first inner cup-shaped conductive layer and recessing the sidewalls of the second outer cup-shaped conductive layer comprises using a wet etch process.

35. The method of claim 33, wherein recessing the sidewalls of the first inner cup-shaped conductive layer is performed in the same process operation as recessing the sidewalls of the second outer cup-shaped conductive layer.

36. The method of claim 33, wherein recessing the sidewalls of the first inner cup-shaped conductive layer is performed in a different process operation from recessing the sidewalls of the second outer cup-shaped conductive layer.

37. The method of claim 33, wherein forming the cup-shaped dielectric layer and forming the second dielectric layer comprises using an atomic layer deposition (ALD) process.

* * * * *